US011212934B2

(12) United States Patent
Chang

(10) Patent No.: US 11,212,934 B2
(45) Date of Patent: Dec. 28, 2021

(54) SERVER CHASSIS

(71) Applicant: CHENBRO MICOM CO., LTD., New Taipei (TW)

(72) Inventor: Yun-Hsiang Chang, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 1 day.

(21) Appl. No.: 16/876,144

(22) Filed: May 18, 2020

(65) Prior Publication Data

US 2020/0375057 A1 Nov. 26, 2020

(30) Foreign Application Priority Data

May 24, 2019 (TW) .................................. 108206614

(51) Int. Cl.
*H05K 5/03* (2006.01)
*H05K 7/14* (2006.01)

(52) U.S. Cl.
CPC ............ *H05K 7/1488* (2013.01); *H05K 5/03* (2013.01)

(58) Field of Classification Search
CPC .. H05K 7/1487; H05K 7/1488; H05K 5/0239; H05K 5/0013; H05K 5/0221; H05K 5/03; H05K 5/023; H05K 5/0204; G06F 1/181; G06F 1/1601; G06F 1/18; G06F 1/187; B65D 43/20; B65D 43/12; E05C 19/06; E05C 19/006; E05C 1/04; E05C 1/10; Y10T 292/0894; Y10T 292/0902;
(Continued)

(56) References Cited

U.S. PATENT DOCUMENTS 6,595,381 B1 * 7/2003 Johnson .................... A45C 5/04
220/345.1
7,374,259 B2 * 5/2008 Wu ......................... G06F 1/181
312/223.2
(Continued)

FOREIGN PATENT DOCUMENTS

KR        20100081775 A  *  7/2010
TW         201419693 A      5/2014
(Continued)

OTHER PUBLICATIONS

TW201448707; Zhou ; abstract and figure (Year: 2020).*

*Primary Examiner* — Janet M Wilkens
(74) *Attorney, Agent, or Firm* — CKC & Partners Co, LLC

(57) ABSTRACT

A server chassis includes a casing, a first upper cover and a second upper cover. The casing includes a bottom plate and two partition plates respectively located on two opposite sides of the bottom plate so a receiving recess is formed. Each partition plate includes a first engaging groove and a second engaging groove. The first upper cover has two first engaging portions. The second upper cover has two second engaging portions. The first upper cover covers a part of the receiving recess by engaging the first engaging portion with the first engaging groove. The second upper covers another part of the receiving recess by engaging the second engaging portion with the second engaging groove. The first upper cover and the second upper cover can be detached from the first engaging grooves and the second engaging grooves in directions away from each other.

8 Claims, 11 Drawing Sheets

(58) Field of Classification Search
CPC ............. Y10T 292/0905; Y10T 292/42; Y10T 292/438; Y10T 292/444; Y10S 292/11
USPC ......... 220/345.1, 245.5, 351, 345.4; 174/50; 312/223.2, 265.5, 265.6; 49/463; 361/379.33, 679.37, 679.58, 726, 727
See application file for complete search history.

(56) References Cited

U.S. PATENT DOCUMENTS

| | | | | |
|---|---|---|---|---|
| 8,045,328 | B1* | 10/2011 | Chen ................ | H05K 7/20727 361/695 |
| 8,827,384 | B2* | 9/2014 | Chen ................ | H05K 7/1487 312/223.2 |
| 8,899,702 | B2* | 12/2014 | Mao ................. | H05K 5/0239 312/332.1 |
| 9,055,689 | B2* | 6/2015 | Yu ................... | H05K 7/1487 |
| 10,798,837 | B1* | 10/2020 | Sauer ............... | H05K 7/1488 |
| 2005/0052828 | A1* | 3/2005 | Chang .............. | G06F 1/181 361/679.02 |
| 2005/0104486 | A1* | 5/2005 | Huang .............. | H05K 5/0013 312/223.2 |
| 2010/0252468 | A1* | 10/2010 | Pratte .............. | A61L 2/26 206/363 |
| 2014/0001942 | A1* | 1/2014 | Mao ................. | H05K 5/0239 312/333 |
| 2015/0061482 | A1* | 3/2015 | Yu ................... | H05K 7/1487 312/326 |
| 2016/0081217 | A1* | 3/2016 | Norton ............. | H05K 7/1488 361/679.31 |
| 2017/0280581 | A1* | 9/2017 | Hesse ............... | H05K 7/1487 |

FOREIGN PATENT DOCUMENTS

| | | | |
|---|---|---|---|
| TW | I512435 B | 12/2015 | |
| TW | I629583 B | 7/2018 | |
| WO | WO-2014204448 A1 * | 12/2014 | ............ G06F 1/185 |

* cited by examiner

SERVER CHASSIS

CROSS-REFERENCE TO RELATED APPLICATION

This application claims priority to Taiwan Application Serial Number 108206614, filed on May 24, 2019, which is herein incorporated by reference.

BACKGROUND

Technical Field

The present disclosure relates to a server chassis. More particularly, the present disclosure relates to a server chassis covered by multiple upper covers.

Description of Related Art

A server chassis of one of the conventional servers usually is covered by a single upper cover, so that components located inside the server chassis can be covered and protected from short circuit or aging due to the influence of dust and foreign objects. On the other hand, for a server chassis with a larger size, the user cannot remove a large cover from the larger server chassis easily and smoothly. Therefore, some manufacturers changed the design to arrange multiple covers to cover different parts of the larger server chassis, respectively.

However, even so, the multiple covers still cannot be removed quickly and conveniently from the larger server chassis in the environment with limited space and specific practicing method.

SUMMARY

One aspect of the present disclosure is to provide a server chassis to solve the aforementioned problems of the prior art.

In one embodiment of the disclosure, a server chassis includes a casing, a first upper cover and a second upper cover. The casing includes a bottom plate and two partition plates respectively located on two opposite sides of the bottom plate, and extending in a same direction. A receiving recess is collectively defined by the bottom plate and the partition plates. Each of the partition plates includes a plate body, a first engaging groove and a second engaging groove, and the first engaging groove and the second engaging groove are symmetrically located on the plate body, and respectively extend toward each other. The first upper cover is provided with two first engaging portions respectively at two opposite sides thereof. The first upper cover is fixed to cover a part of the receiving recess by engaging the first engaging portions with the first engaging grooves, respectively. The second upper cover is provided with two second engaging portions respectively at two opposite sides thereof. The second upper cover is fixed to cover the other part of the receiving recess by engaging the second engaging portions with the second engaging grooves, respectively. Thus, the first upper cover and the second upper cover are allowed to be detached from the first engaging grooves and the second engaging grooves respectively in directions away from each other.

According to one or more embodiments of the disclosure, in the foregoing server chassis, the first engaging groove includes a first entrance and a first groove. The first entrance is formed on a side edge of the plate body opposite to the bottom plate, and the first groove is formed on the plate body to be connected to the first entrance. An inner wall of the first groove extends in a first direction. The second engaging groove includes a second entrance and a second groove. The second entrance is formed on the side edge of the plate body opposite to the bottom plate, and the second groove is formed on the plate body to be connected to the second entrance. An inner wall of the second groove extends in a second direction. Thus, the first direction and the second direction face to each other, the first groove is located between the first entrance and the second groove, and the second groove is located between the second entrance and the first groove.

According to one or more embodiments of the disclosure, in the foregoing server chassis, the first upper cover includes a first cover body and two first side plates. The first side plates are respectively located at two opposite sides of the first cover body, and extend in a same direction. The first cover body and the first side plates are collectively defined a first inner space. Each of the first engaging portions includes a first post protruding towards the first inner space. When the first upper cover covers the casing, each of the first posts enters the first groove through the first entrance, and moves to an end of the first groove along the first direction.

According to one or more embodiments of the disclosure, in the foregoing server chassis, the second upper cover includes a second cover body and two second side plates. The second side plates are respectively located at two opposite sides of the second cover body, and extend in a same direction. The second cover body and the second side plates are collectively defined a second inner space. Each of the second engaging portions includes a second post protruding towards the second inner space. When the second upper cover covers the casing, each of the second posts enters the second groove through the second entrance, and moves to an end of the second groove along the second direction.

According to one or more embodiments of the disclosure, in the foregoing server chassis, one of the first engaging grooves and one of the second engaging grooves, which are arranged on the same partition plate are formed on the plate body according to a mirror symmetry arrangement.

According to one or more embodiments of the disclosure, in the foregoing server chassis, the casing further includes a first outlet and a second outlet which are respectively located at two opposite ends of the bottom plate. When the first upper cover and the second upper cover are detached from the first engaging grooves and the second engaging grooves in the directions away from each other, the first upper cover passes over the first outlet and the second upper cover passes over the second outlet.

According to one or more embodiments of the disclosure, in the foregoing server chassis, each of the partition plates includes a first fastening portion, and the first upper cover includes two first elastic fasteners, and each of the first elastic fasteners is removably engaged with the first fastening portion of each of the partition plates.

According to one or more embodiments of the disclosure, in the foregoing server chassis, each of the partition plates includes a second fastening portion, and the second upper cover includes two second elastic fasteners, and each of the second elastic fasteners is removably engaged with the second fastening portion of each of the partition plates.

According to one or more embodiments of the disclosure, in the foregoing server chassis, the first upper cover and the second upper cover are directly joined with each other.

According to one or more embodiments of the disclosure, in the foregoing server chassis, the first upper cover includes a plurality of protruding ribs. The protruding ribs are spaced arranged on an inner surface of the first upper cover facing towards the receiving recess, and commonly extending towards the second upper cover. Each of the protruding ribs and the inner surface of the first upper cover collectively define an engaging notch therebetween. The second upper cover includes an elongated engaging rib located on an inner surface of the second upper cover facing towards the receiving recess, and extending toward the first upper cover for removably receiving in the engaging notches.

Thus, based on the embodiments above, regardless of the environment with limited space and specific practicing method, the first upper cover or the second upper cover of the server chassis of the present disclosure does not have to be detached from the corresponding engaging groove in order, so the first upper cover or the second upper cover can be detached from the chassis independently, and the second upper cover does not need to wait until the first upper cover is disengaged from the first engaging groove. Therefore, not only the present disclosure fits the space limitations, but also allows users to quickly or conveniently repair or replace the components located inside the server chassis.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the disclosure and, together with the description, serve to explain the principles of the disclosure. In the drawings.

DETAILED DESCRIPTION

Figure 1:
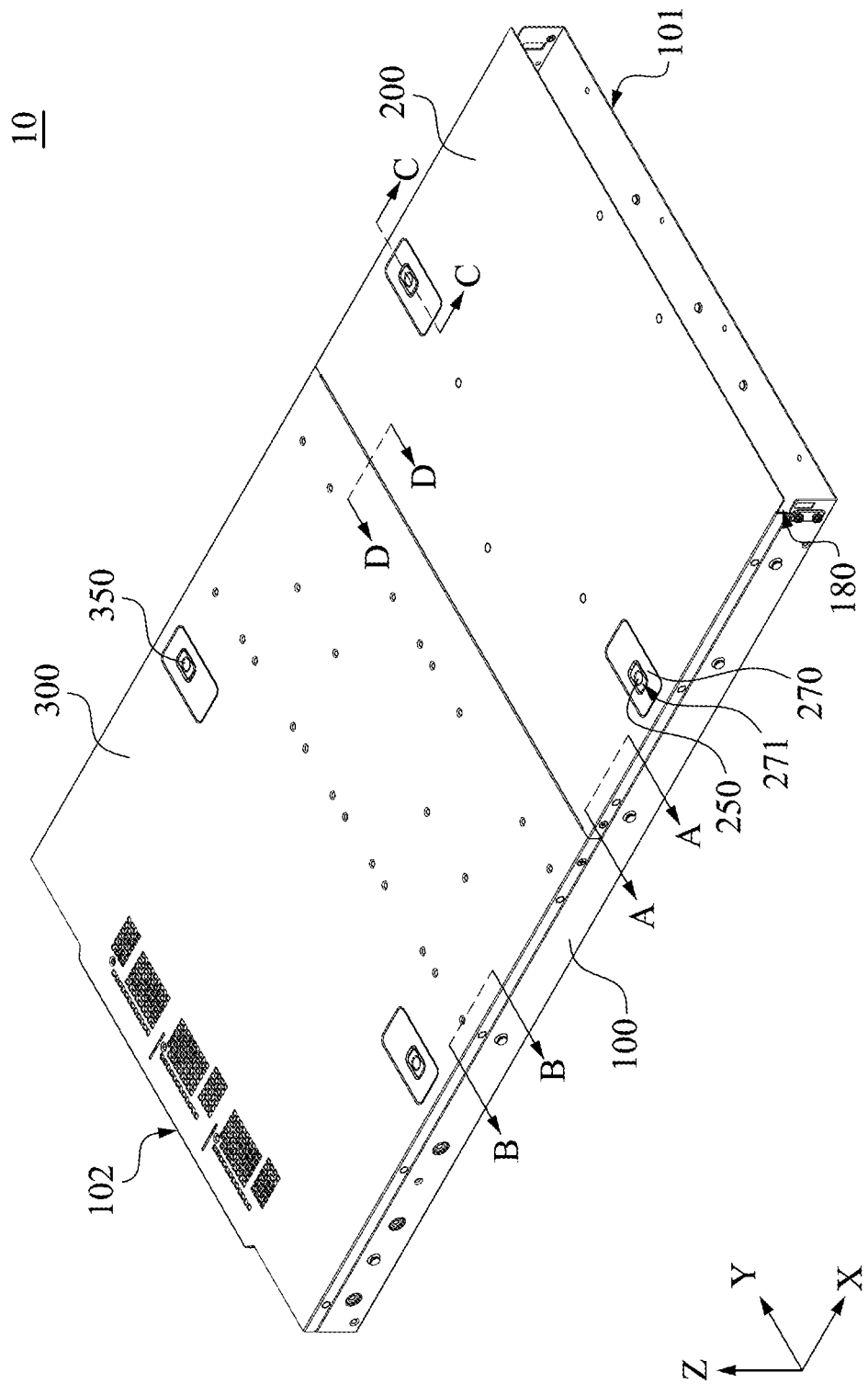
FIG. 1 is a perspective schematic view of a server chassis according to one embodiment of present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
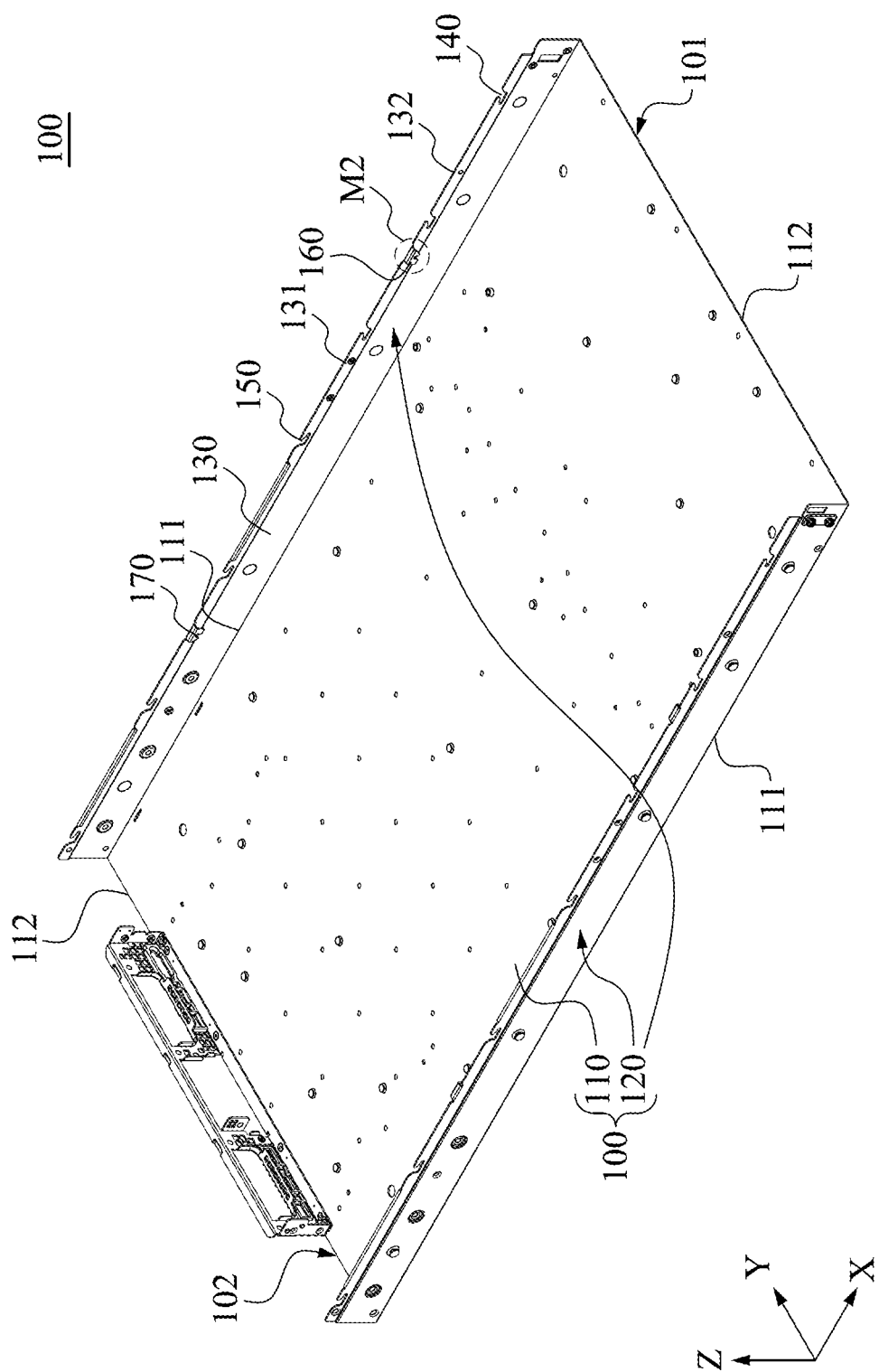
FIG. 2 is a perspective schematic view of the casing of FIG. 1.
Figure 3A:
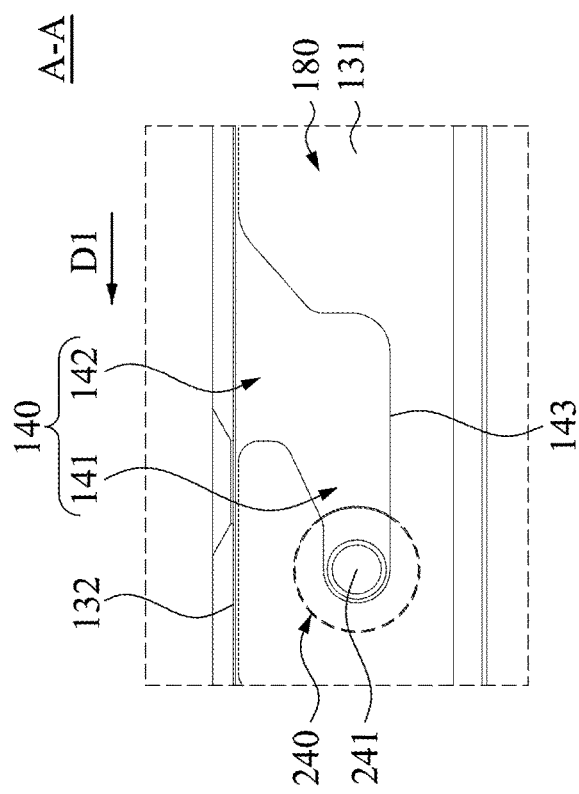
FIG. 3A is a partial cross-sectional view of the server chassis of FIG. 1 viewed along a line A-A.
Figure 3B:
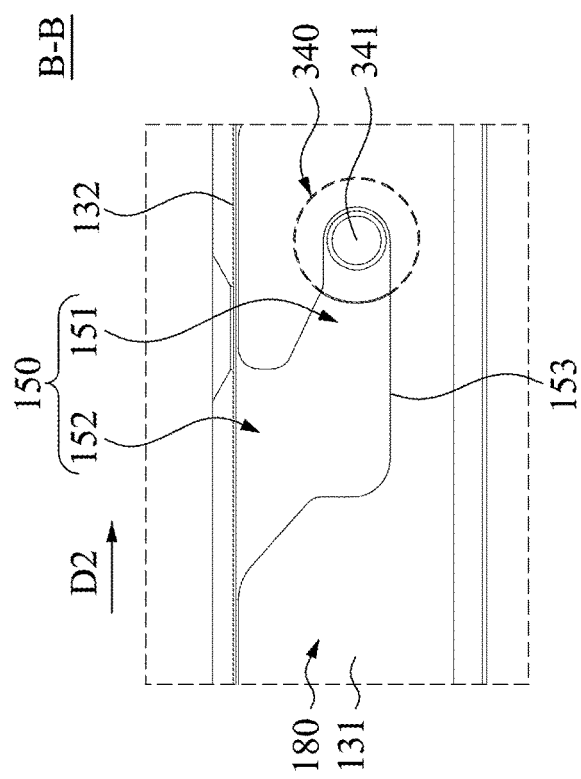
FIG. 3B is a partial cross-sectional view of the server chassis of FIG. 1 viewed along a line B-B.
Figure 4:
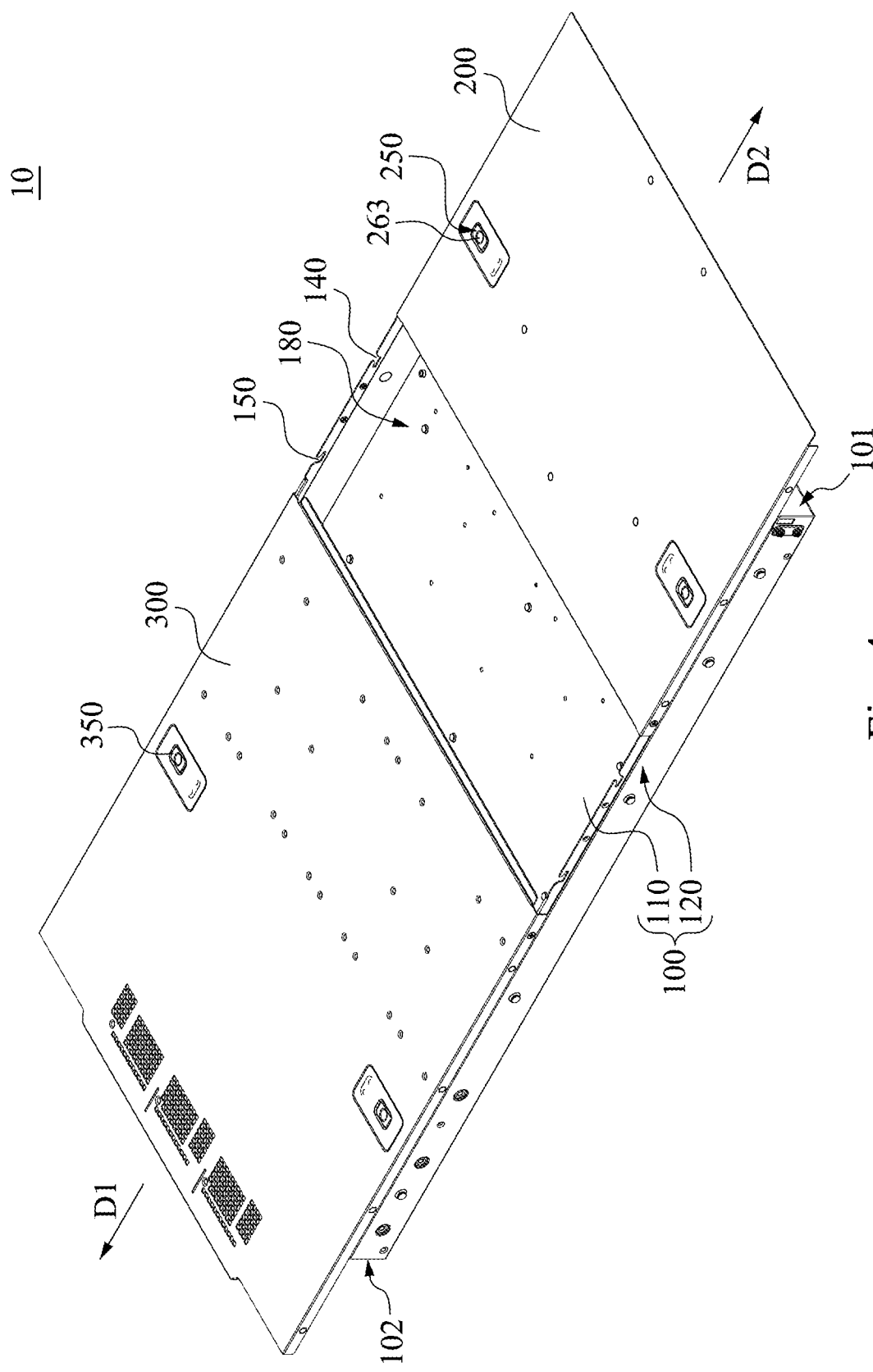
FIG. 4 is an operational schematic view of the first upper cover and the second upper cover of FIG. 1 respectively detached from the casing.

Reference is now made to FIG. 1 to FIG. 4 in which FIG. 1 is a perspective schematic view of a server chassis 10 according to one embodiment of present disclosure, FIG. 2 is a perspective schematic view of the casing 100 of FIG. 1, FIG. 3A is a partial cross-sectional view of the server chassis 10 of FIG. 1 viewed along a line A-A, FIG. 3B is a partial cross-sectional view of the server chassis 10 of FIG. 1 viewed along a line B-B, and FIG. 4 is an operational schematic view of the first upper cover 200 and the second upper cover 300 of FIG. 1 respectively detached from the casing 100. As shown in FIG. 1 and FIG. 2, in one embodiment, the server chassis 10 includes a casing 100, a first upper cover 200 and a second upper cover 300. The first upper cover 200 and the second upper cover 300 collectively cover the top of the casing 100. The casing 100 includes a bottom plate 110 and two partition plates 120 respectively located on two opposite sides (e.g., long sides 111) of the bottom plate 110, and extending in a same direction (e.g., Z axis) away from the bottom plate 110. A receiving recess 180 is collectively defined by the bottom plate 110 and the partition plates 120 for receiving internal components of the server (not shown in figures). Each of the partition plates 120 includes a plate body 130, at least one first engaging groove 140 and at least one second engaging groove 150. The plate body 130 has a long axis direction (e.g., X axis). The first engaging groove 140 and the second engaging groove 150 are symmetrically located on a bending rib 131 of the plate body 130 of each of the partition plates 120, and the first engaging groove 140 and the second engaging groove 150 respectively extend toward each other. In this embodiment, the bottom plate 110 and the two partition plates 120 are integrally formed. However, the disclosure is not limited thereto.

As shown in FIG. 1 and FIG. 3A, the first upper cover 200 is provided with at least two first engaging portions 240 respectively at two opposite sides of the first upper cover 200. The first upper cover 200 is fixed to cover a part of the receiving recess 180 by engaging the first engaging portions 240 with the first engaging grooves 140 located at two sides of the casing 100, respectively. As shown in FIG. 1 and FIG. 3B, the second upper cover 300 is provided with two second engaging portions 340 respectively at two opposite sides of the second upper cover 300. The second upper cover 300 is fixed to cover the other part of the receiving recess 180 by engaging the second engaging portions 150 with the second engaging grooves 150 located at two sides of the casing 100, respectively.

Thus, as shown in FIG. 3A and FIG. 3B, when a user removes the first upper cover 200, the second upper cover 300, or both of them from the casing 100, the first upper cover 200, the second upper cover 300, or both of them can be moved for removal in directions facing away from each other.

More specifically, the casing 100 further includes a first outlet 101 and a second outlet 102 which are respectively located at two opposite ends (e.g., short sides 112) of the bottom plate 110, and in communication with the receiving recess 180. Thus, when the first engaging portions 240 of the first upper cover 200 are detached from both of the first engaging grooves 140 located at two sides of the casing 100, the first upper cover 200 passes over the first outlet 101 along the long axis direction (e.g., X axis); when the second engaging portions 340 of the second upper cover 300 are detached from both of the second engaging grooves 150 located at two sides of the casing 100, the second upper cover 300 passes over the second outlet 102 along the long axis direction (e.g., X axis).

As shown in FIG. 2 and FIG. 3A, the first engaging groove 140 includes a first entrance 141 and a first groove 142. The first entrance 141 is formed on a side edge 132 of the plate body 130 opposite to the bottom plate 110. The first groove 142 is formed on the plate body 130 to be connected to the first entrance 141, and the first groove 142 extends in a first direction D1. More specifically, an inner wall 143 of the first groove 142 extends in the first direction D1. For example, the inner wall 143 of the first groove 142 opposite to the first entrance 141 extends along the long axis direction (e.g., X axis) in the first direction D1.

As shown in FIG. 2 and FIG. 3B, the second engaging groove 150 includes a second entrance 151 and a second groove 152. The second entrance 151 is formed on the side edge 132 of the plate body 130 opposite to the bottom plate 110. The second groove 152 is formed on the plate body 130 to be connected to the second entrance 151, and the second groove 152 extends in a second direction D1. More specifically, an inner wall 153 of the second groove 152 extends in the second direction D2. For example, the inner wall 153 of the second groove 152 opposite to the second entrance 151 extends along the long axis direction (e.g., X axis) in the second direction D2. The second direction D2 and the first direction D1 are faced to each other. The first groove 142 is located between the first entrance 141 and the second groove 152, and the second groove 152 is located between the second entrance 151 and the first groove 142.

In the embodiment, one of the first engaging grooves 140 and one of the second engaging grooves 150, which are arranged on the same partition plate 120 are formed on the plate body 130 according to a mirror symmetry arrangement in which an imaginary mirror line of the mirror symmetry arrangement is between the first upper cover 200 and the second upper cover 300. However, the disclosure is not limited thereto.

Figure 5A:
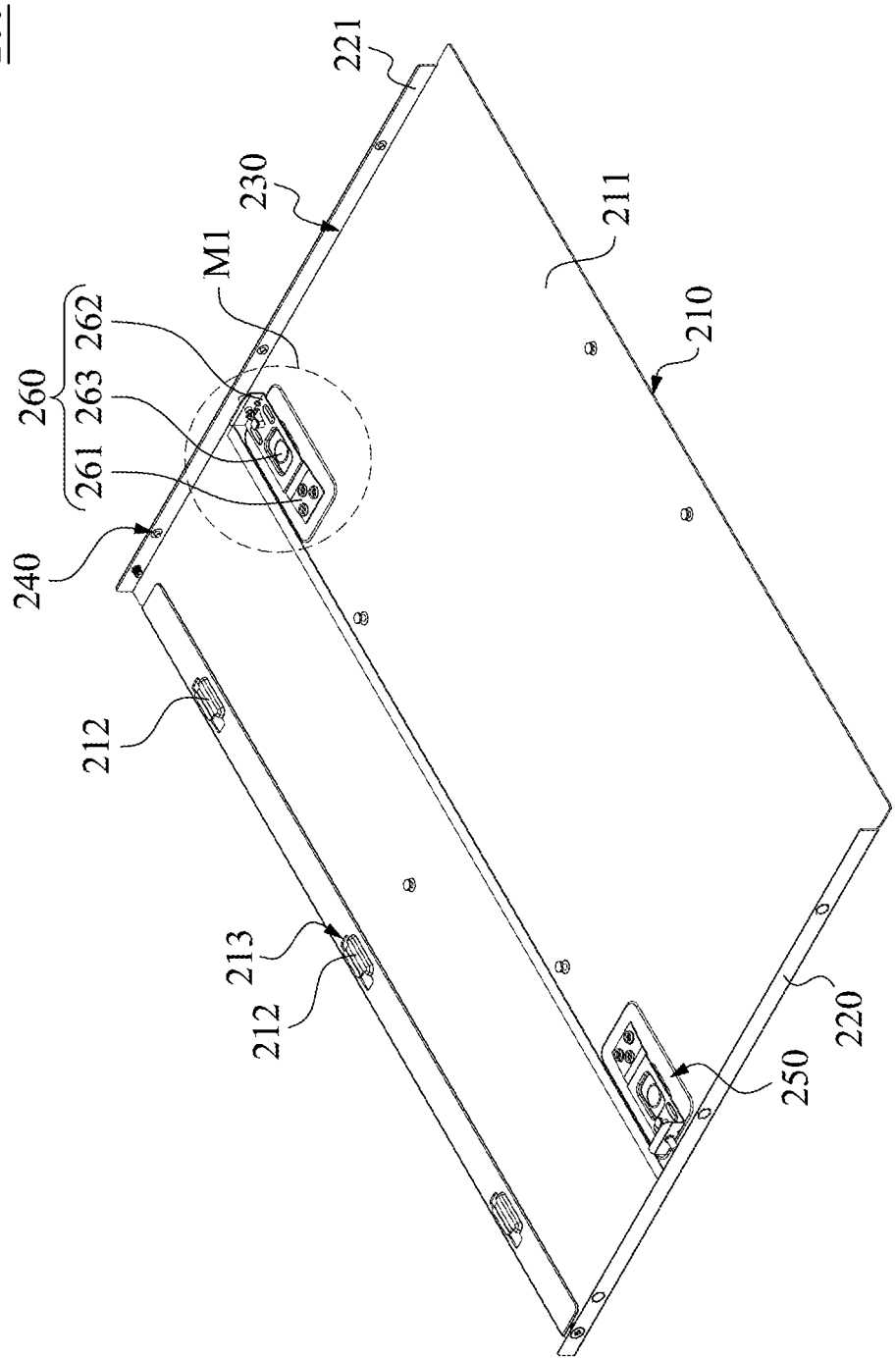
FIG. 5A is a perspective schematic view of the first upper cover of FIG. 1.
Figure 5B:
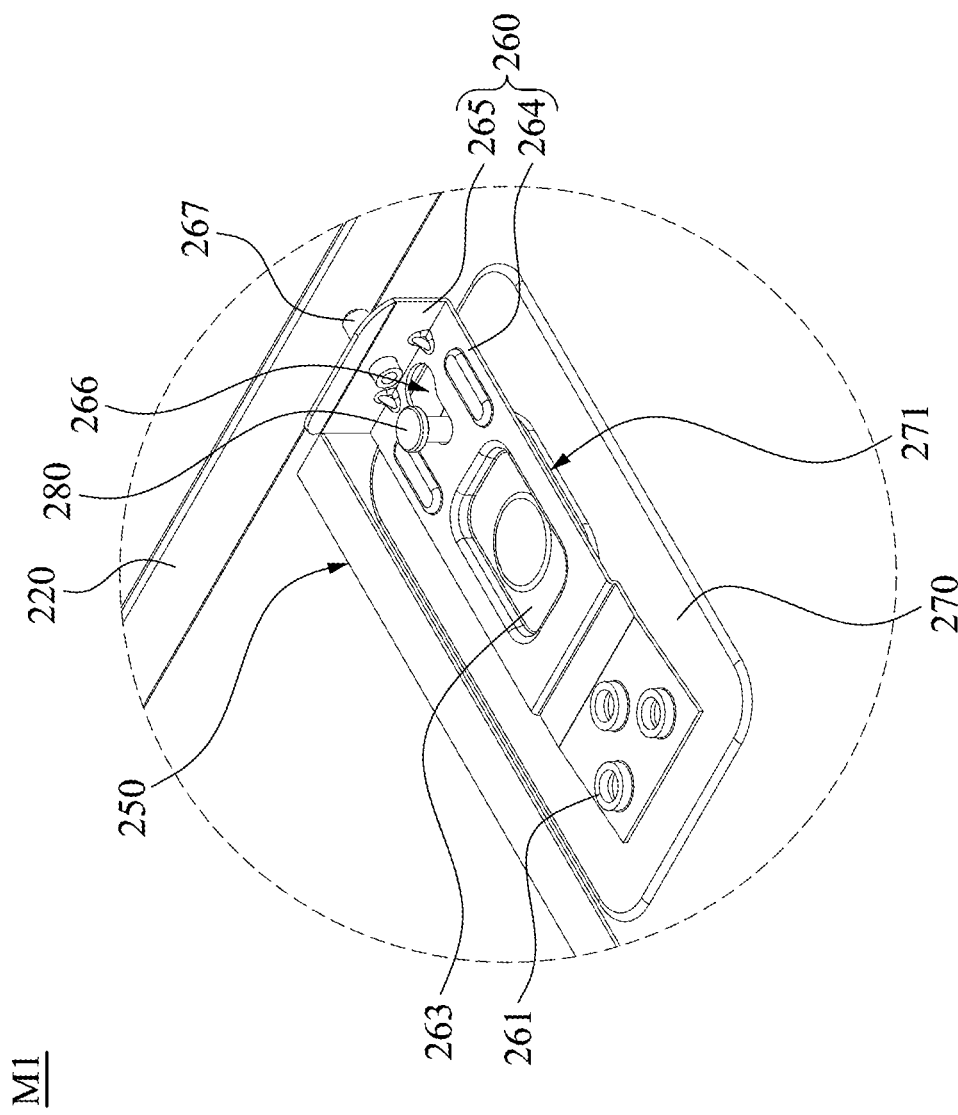
FIG. 5B is a partial enlargement view of an area M1 of the casing of FIG. 5A.

FIG. 5A is a perspective schematic view of the first upper cover 200 of FIG. 1, and FIG. 5B is a partial enlargement view of an area M1 of the casing 100 of FIG. 5A. As shown in FIG. 3A and FIG. 5A, the first upper cover 200 includes a first cover body 210 and two first side plates 220. The first side plates 220 are respectively located at two opposite sides of the first cover body 210, and extend in a same direction (e.g., Z axis) away from the first cover body 210. The first cover body 210 and the first side plates 220 are collectively defined a first inner space 230. Each of the first engaging portions 240 includes a first post 241. The first post 241 is located on the inner surface 221 of the first side plates 220 facing towards the first inner space 230, and the first post 241 protrudes towards the first inner space 230. In this embodiment, the first cover body 210 and the two first side plates 220 are integrally formed. However, this creation is not limited thereto.

Thus, when the user is desired to cover the casing 100 with the first cover body 210, the user allows each of the first posts 241 to enter the first groove 142 through the first entrance 141, and move to an end of the first groove 142 in the first direction D1, so that each of the first post 241 is limited in the corresponding first groove 142.

Figure 6:
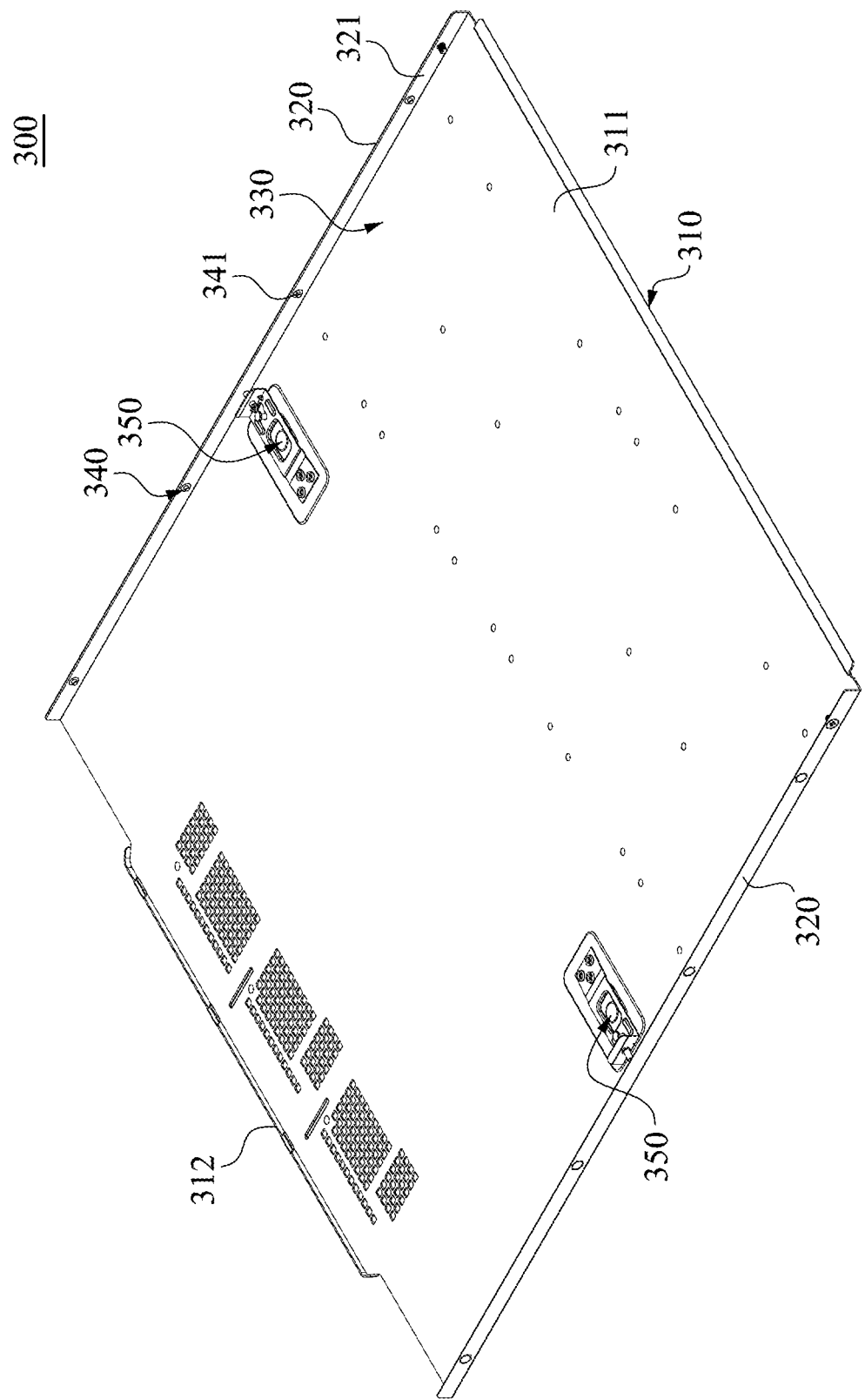
FIG. 6 is a perspective schematic view of the second upper cover of FIG. 1.

FIG. 6 is a perspective schematic view of the second upper cover 300 of FIG. 1. As shown in FIG. 6, the second upper cover 300 includes a second cover body 310 and two second side plates 320. The second side plates 320 are respectively located at two opposite sides of the second cover body 310, and extend in a same direction (e.g., Z axis) away from the second cover body 310. The second cover body 310 and the second side plates 320 are collectively defined a second inner space 330. Each of the second engaging portions 340 includes a second post 341. The second post 341 is located on the inner surface 321 of the second side plates 320 facing towards the second inner space 330, and the second post 341 protrudes towards the second inner space 330. In this embodiment, the second cover body 310 and the two second side plates 320 are integrally formed. However, this disclosure is not limited thereto.

Thus, when the user is desired to cover the casing 100 with the second cover body 310, the user allows each of the second posts 341 to enter the second groove 152 through the second entrance 151, and move to an end of the second groove 152 in the second direction D2, so that each of the second post 341 is limited in the corresponding the second groove 152.

Figure 7:
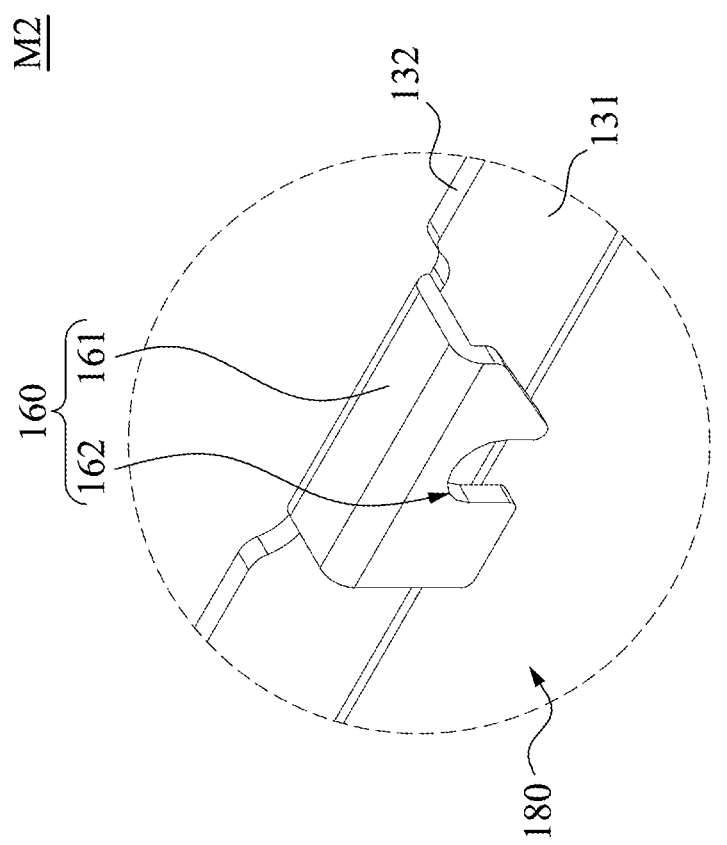
FIG. 7 is a partial enlargement view of an area M2 of the casing of FIG. 2.

FIG. 7 is a partial enlargement view of an area M2 of the casing 100 of FIG. 2. As shown in FIG. 2 and FIG. 7, in the embodiment, each of the partition plates 120 includes a first fastening portion 160 and a second fastening portion 170. The first fastening portion 160 and the second fastening portion 170 are symmetrically arranged on the plate body 130 of each of the partition plates 120 and extend toward the receiving recess 180 (e.g., Y axis). For example, the first fastening portion 160 includes a folding lug 161 and a notch 162. The folding lug 161 is located on the side edge 132 of the plate body 130 facing away from the bottom plate 110, and extends towards the receiving recess 180. The notch 162 is located at the lower edge of the folding lug 161, and in communication with the receiving recess 180. It is noted, the structure of the second fastening portion 170 is substantially the same as the first fastening portion 160, so that it will not be repeated again hereinafter.

Figure 8:
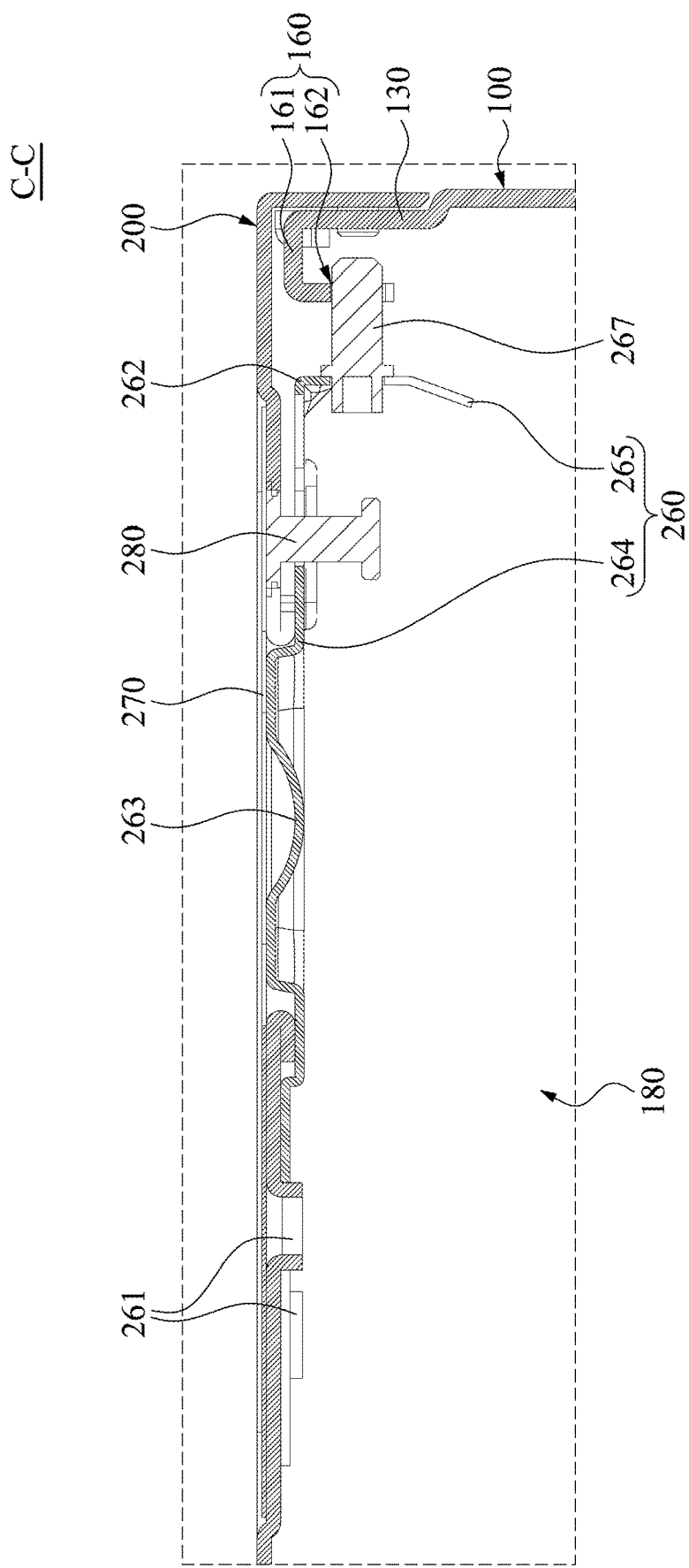
FIG. 8 is a partial cross-sectional view of the server chassis of FIG. 1 viewed along a line C-C.

FIG. 8 is a partial cross-sectional view of the server chassis of FIG. 1 viewed along a line C-C. As shown in FIG. 5A and FIG. 8, in the embodiment, the first upper cover 200 includes two first elastic fasteners 250 symmetrically located on the first cover body 210. Each of the first elastic fasteners 250 includes an elastic piece 260 and a stopping post 267. One end of the elastic piece 260 is provided with a securing portion 261 that is fixed on the first cover body 210, the other end is provided with a free end 262. For example, the elastic piece 260 is L-shaped, and includes a first part 264 and a second part 265. The first part 264 is parallel to the first cover body 210, and one end of the first part 264 is locked on the first cover body 210, and the first part 264 and the second part 265 are connected with each other. The second part 265 extends downward, and the stopping post 267 is fixed on the second part 265 and removably abuts the notch 162. In this embodiment, the first part 264 and the second part 265 are integrally formed, however, the disclosure is not limited thereto.

Thus, when each of the first posts 241 of the first upper cover 200 is limited to the corresponding first groove 142, and the first elastic fastener 250 is removably snapped on the first fastening portion 160 of each of the partition plates 120, that is, the stopping post 267 is stopped within the notch 162. Thus, the first upper cover 200 can be fixedly covered on the casing 100.

Furthermore, as shown in FIG. 1 and FIG. 5B, each of the first elastic fasteners 250 further includes a decoration plate 270 (FIG. 1) and a limiting post 280 (FIG. 5B). The decoration plate 270 is located on the first upper cover 200 and formed with an opening 271 thereon. The elastic piece 260 further is provided with a pressing portion 263 and a hardy hole 266. The pressing portion 263 is located on the first part 264 of the elastic piece 260, and is exposed outwards from the first upper cover 200 through the opening 271 for the user to press the pressing portion 263 to move the stopping post 267. The limiting post 280 is uprightly disposed on the first part 264 of the elastic piece 260, and is located within the hardy hole 266, and extends toward the receiving recess 180 to prevent the elastic piece 260 from being excessively deformed.

In the embodiment, the second upper cover 300 includes two second elastic fasteners 350 symmetrically located on the second cover body 310. Thus, when each of the second posts 341 of the second upper cover 300 is limited in the corresponding second groove 152, and the second elastic fastener 350 is removably engaged with the second fastening portion 170 of each of the partition plates 120, therefore, the second upper cover 300 can be fixedly closed on the casing 100. It is noted, the structure of the second elastic fastener 350 is substantially the same as the above description of the first elastic fastener 250, so that it will not be repeated again hereinafter.

Figure 9:
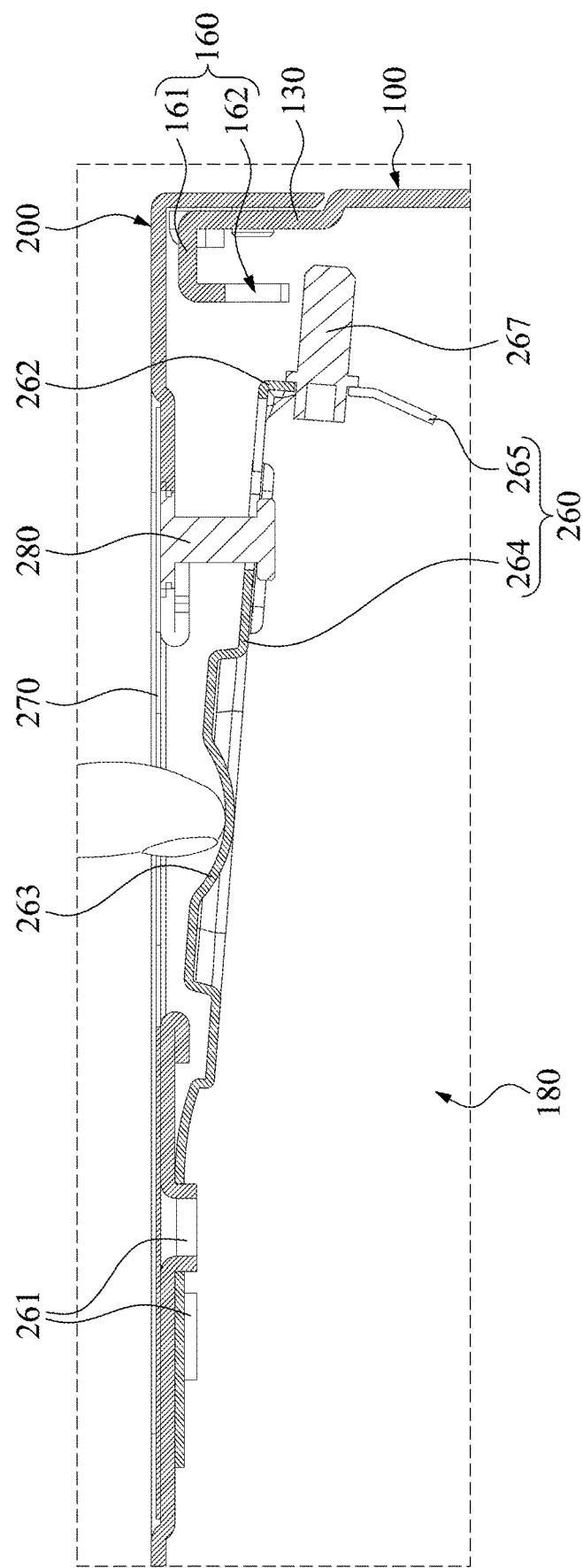
FIG. 9 is an operational schematic view of the first elastic fastener of FIG. 8 being unlocked.

FIG. 9 is an operational schematic view of the first elastic fastener of FIG. 8 being unlocked. As shown in FIG. 4 and FIG. 9, for example, when a user is desired to remove the first upper cover 200 from the casing 100, the user first presses the pressing portions 263 of the first elastic fasteners 250 symmetrically located on the first cover body 210 with both of hands, so that each of the stopping posts 267 is synchronously moved outwards from the notch 162 with corresponding elastic piece 260 so as to be disengaged from the first fastening portion 160; next, the user moves the first engaging portions 240 of the first upper cover 200 to be detached from the first engaging grooves 140 along the second direction D2 (FIG. 4). Similarly, when the user is desired to remove the second upper cover 300 from the casing 100, the user can remove the second upper cover 300 (FIG. 4) from the casing 100 in the first direction D1 in order according to the above-mentioned manner, so details will not be repeated here again.

Regardless of the environment with limited space and specific practicing method, the first upper cover 200 or the second upper cover 300 does not have to be detached from the corresponding engaging groove 140, 150 in order, so the first upper cover or the second upper cover can be detached from the chassis independently, and the second upper cover does not need to wait until the first upper cover is disengaged from the first engaging groove. Therefore, not only the present disclosure fits the space limitations, but also allows users to quickly or conveniently repair or replace the components located inside the server chassis.

Figure 10:
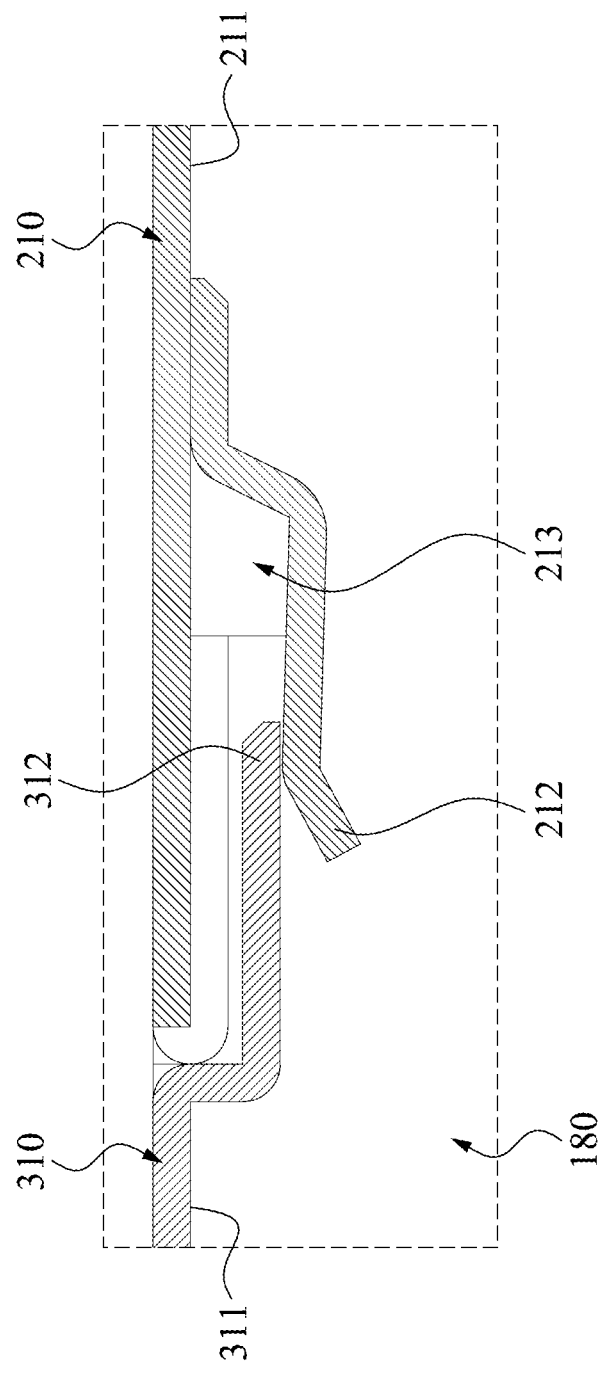
FIG. 10 is a partial cross-sectional view of the server chassis of FIG. 1 viewed along a line D-D.

FIG. 10 is a partial cross-sectional view of the server chassis of FIG. 1 viewed along a line D-D. In the embodiment, as shown in FIG. 1 and FIG. 10, when both the first upper cover 200 and the second upper cover 300 are covered on the casing 100, the first upper cover 200 and the second upper cover 300 are directly joined with each other. However, the disclosure is not limited to thereto. In other embodiments, the server chassis 10 may be redesigned so that the first upper cover 200 and the second upper cover 300 will not be directly joined to each other.

For example, as shown in FIG. 5A and FIG. 10, the first upper cover 200 includes a plurality of protruding ribs 212. The protruding ribs 212 are spaced arranged on an inner surface 211 of the first upper cover 200 facing towards the receiving recess 180, and commonly extending towards the second upper cover 300. Each of the protruding ribs 212 and the inner surface 211 of the first upper cover 200 collectively define an engaging notch 213 therebetween. As shown in FIG. 6 and FIG. 10, the second upper cover 300 includes an elongated engaging rib 312 located on an inner surface of the second upper cover 300 facing towards the receiving recess 180, and extending toward the first upper cover 200 for removably receiving in the engaging notches 213.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A server chassis, comprising:
   a casing comprising a bottom plate and two partition plates respectively located on two opposite sides of the bottom plate, and extending in a same direction, so that a receiving recess is collectively defined by the bottom plate and the partition plates, and each of the partition plates comprising a plate body, a first engaging groove and a second engaging groove, the first engaging groove and the second engaging groove being symmetrically located on the plate body, and respectively extend toward each other;
   a first upper cover provided with two first engaging portions respectively at two opposite sides thereof and a plurality of protruding ribs spaced arranged on an inner surface of the first upper cover facing towards the receiving recess, wherein each of the protruding ribs and the inner surface of the first upper cover collectively define an engaging notch therebetween, and the first upper cover is fixed to cover a part of the receiving recess by engaging the first engaging portions with the first engaging grooves, respectively; and
   a second upper cover provided with two second engaging portions respectively at two opposite sides thereof, wherein the second upper cover is fixed to cover the other part of the receiving recess by engaging the second engaging portions with the second engaging grooves, respectively, and an elongated engaging rib located on an inner surface of the second upper cover facing towards the receiving recess, extending toward the first upper cover, and directly entering the engaging notches,
   wherein the first upper cover and the second upper cover are directly joined with each other, and the protruding ribs are commonly extending towards the second upper cover,
   wherein the first upper cover and the second upper cover are allowed to be detached from the first engaging grooves and the second engaging grooves respectively in directions away from each other.

2. The server chassis of claim 1, wherein the first engaging groove comprises a first entrance and a first groove, the first entrance is formed on a side edge of the plate body opposite to the bottom plate, and the first groove is formed on the plate body to be connected to the first entrance, and an inner wall of the first groove extends in a first direction; and
   the second engaging groove comprises a second entrance and a second groove, the second entrance is formed on the side edge of the plate body opposite to the bottom plate, and the second groove is formed on the plate body to be connected to the second entrance, and an inner wall of the second groove extends in a second direction, wherein the first direction and the second direction are faced to each other, the first groove is located between the first entrance and the second groove, and the second groove is located between the second entrance and the first groove.

3. The server chassis of claim 2, wherein the first upper cover comprises:
a first cover body; and
two first side plates respectively located at two opposite sides of the first cover body, and extending in a same direction, the first cover body and the first side plates that are collectively defined a first inner space, and each of the first engaging portions comprising a first post protruding towards the first inner space,
wherein when the first upper cover covers the casing, each of the first posts enters the first groove through the first entrance, and moves to an end of the first groove along the first direction.

4. The server chassis of claim 2, wherein the second upper cover comprises:
a second cover body; and
two second side plates respectively located at two opposite sides of the second cover body, and extending in a same direction, the second cover body and the second side plates that are collectively defined a second inner space, and each of the second engaging portions comprising a second post protruding towards the second inner space,
wherein when the second upper cover covers the casing, each of the second posts enters the second groove through the second entrance, and moves to an end of the second groove along the second direction.

5. The server chassis of claim 2, wherein one of the first engaging grooves and one of the second engaging grooves, which are arranged on the same partition plate are formed on the plate body according to a mirror symmetry arrangement.

6. The server chassis of claim 1, wherein the casing further comprising a first outlet and a second outlet which are respectively located at two opposite ends of the bottom plate,
wherein when the first upper cover and the second upper cover are detached from the first engaging grooves and the second engaging grooves in the directions away from each other, the first upper cover passes over the first outlet and the second upper cover passes over the second outlet.

7. The server chassis of claim 1, wherein each of the partition plates comprises a first fastening portion, and the first upper cover comprises two first elastic fasteners, and each of the first elastic fasteners is removably engaged with the first fastening portion of each of the partition plates.

8. The server chassis of claim 1, wherein each of the partition plates comprises a second fastening portion, and the second upper cover comprises two second elastic fasteners, and each of the second elastic fasteners is removably engaged with the second fastening portion of each of the partition plates.

* * * * *